(12) United States Patent
Liu et al.

(10) Patent No.: US 8,352,834 B2
(45) Date of Patent: Jan. 8, 2013

(54) HIGH THROUGHPUT INTERLEAVER / DEINTERLEAVER

(75) Inventors: Binfan Liu, Livermore, CA (US); Junyi Xu, Fremont, CA (US)

(73) Assignee: BroadLogic Network Technologies Inc., San Jose, CA (US)

( * ) Notice: Subject to any disclaimer, the term of this patent is extended or adjusted under 35 U.S.C. 154(b) by 69 days.

(21) Appl. No.: 12/652,167

(22) Filed: Jan. 5, 2010

(65) Prior Publication Data

US 2011/0113305 A1     May 12, 2011

Related U.S. Application Data

(60) Provisional application No. 61/260,830, filed on Nov. 12, 2009.

(51) Int. Cl.
| | |
|---|---|
| G06F 11/00 | (2006.01) |
| H03M 13/00 | (2006.01) |
| H04L 1/18 | (2006.01) |
| G11C 29/00 | (2006.01) |

(52) U.S. Cl. ........ 714/767; 714/701; 714/751; 714/752; 714/763

(58) Field of Classification Search ................ None
See application file for complete search history.

(56) References Cited

U.S. PATENT DOCUMENTS

| | | | |
|---|---|---|---|
| 6,035,427 A | 3/2000 | Kweon | |
| 6,058,496 A | 5/2000 | Gillis et al. | |
| 6,724,686 B2 | 4/2004 | Ooishi et al. | |
| 6,964,005 B2 | 11/2005 | Hollums | |
| 7,051,171 B1 | 5/2006 | Liu et al. | |
| 7,600,163 B2 | 10/2009 | Wan et al. | |
| 2002/0188905 A1 | 12/2002 | Hollums | |
| 2003/0103407 A1 | 6/2003 | Ooishi et al. | |
| 2005/0063421 A1 | 3/2005 | Wan et al. | |
| 2005/0066133 A1* | 3/2005 | Rao | 711/149 |
| 2005/0268027 A1* | 12/2005 | Katsuki et al. | 711/105 |
| 2010/0191903 A1* | 7/2010 | Rao | 711/104 |
| 2010/0332718 A1* | 12/2010 | Farrell et al. | 711/5 |

OTHER PUBLICATIONS

Numata, K., et al., "New Nibbled-Page Architecture for High-Density DRAM's", Aug. 1989, IEEE Journal of Solid-State Circuits, vol. 24, No. 4, pp. 900-904.

Saito, M., et al., "500-Mb/s Nonprecharged Data Bus for High-Speed DRAM's", Nov. 1998, vol. 33, No. 11, pp. 1720-1730.

Shimizu, K., et al., "Reconfigurable Adaptive FEC System with Interleaving", 2005, IEEE, pp. 1252-1255.

Wellig, Armin, "Two-Stage Interleaving Network Analysis to Design Area- and Energy Efficient 3GPP-Compliant Receiver Architectures", 2004, IEEE, pp. 65-70.

\* cited by examiner

*Primary Examiner* — Guerrier Merant
(74) *Attorney, Agent, or Firm* — Sterne, Kessler, Goldstein & Fox PLLC

(57) ABSTRACT

Systems and methods for performing high-speed multi-channel forward error correction using external DDR SDRAM is provided. According to one exemplary aspect, an interleaver/deinterleaver performs both read and write accesses to the DDR SDRAM that are burst-oriented by hiding active and precharge cycles in order to achieve high data rate operations. The interleaver/deinterleaver accesses data in the DDR SDRAM as read blocks and write blocks. Each block includes two data sequences. Each data sequence further includes a predetermined number of data words to be interleaved/deinterleaved. The PRECHARGE and ACTIVE command for one data sequence is issued when a preceding data sequence is being processed. Data in one read/write data sequence has the same row address within the same bank of the DDR SDRAM.

7 Claims, 12 Drawing Sheets

HIGH THROUGHPUT INTERLEAVER / DEINTERLEAVER

CROSS REFERENCES TO RELATED APPLICATIONS

This application claims priority to U.S. Provisional Application No. 61/260,830 filed on Nov. 12, 2009 and entitled "High Througouput Interleaver/De-Interleaver" the content of which is incorporated by reference herein in its entirety for all purposes.

BACKGROUND

The present invention generally relates to forward error correction (FEC) and, more specifically, to a method and system for providing high-speed, multi-channel FEC using external DDR SDRAM.

Convolutional interleavers and deinterleavers are commonly employed in an FEC scheme to protect against a burst of errors from being sent to a block decoder, such as a Reed-Solomon decoder. It is well known that interleaving techniques improve error correction capability. U.S. Pat. No. 7,051,171 provides a multi-channel interleaver/deinterleaver for use with conventional SDRAM type memory.

FIG. 1 is a simplified schematic block diagram illustrating a typical convolutional interleaver and deinterleaver. In many applications, interleaved data are buffered using static random access memory (SRAM). The width of data to be stored into the memory matches the interleaver/deinterleaver symbol size. For the interleaver 110, each successive branch (102, 103, . . . , 109) has J more symbols than the immediately preceding branch. For example, branch 103 has J more symbols than branch 102. To the contrary, for the deinterleaver 120, each successive branch (102', 103', 104', . . . , 109') has J fewer symbols than the immediately preceding branch. For example, branch 103' has J fewer symbols than branch 102'. Unless indicated otherwise, "I" represents the interleaving depth and "J" represents the interleaving increment. Thus, one branch has a different delay from another branch. The foregoing characteristic, i.e., the delay difference, thus creates sequential-write addresses and non-sequential-read addresses, or vice versa, when conventional memory access is used. This asymmetry between write and read addresses affects data throughput. Furthermore, another problem associated with SRAM is that SRAM is relatively more expensive than other types of memory, such as, double data rate synchronous dynamic random access memory (DDR SDRAM).

In some applications, DDR SDRAM is used to store interleaved data. However, use of DDR SDRAM based on the interleaving/deinterleaving approach described above also has its disadvantages. For example, one disadvantage is that by using conventional SDRAM access, the overhead ACTIVE and PRECHARGE command cycles for non-sequential read or write addresses significantly reduce data throughput. Another disadvantage is that since DDR memory access is burst-oriented, conventional methods for access, the burst cannot reach its maximum efficiency for non-sequential read or non-sequential write.

Hence, it would be desirable to provide a method and system that is able to handle interleaving and deinterleaving in a more efficient manner when using DDR SDRAM.

SUMMARY

This disclosure generally relates to data storage in a DDR memory. Specifically, the disclosure describes a high throughput data interleaver/deinterleaver for use with DDR memory. Aspects of the invention can be equally applied to single-channel and multi-channel applications.

According to an exemplary embodiment of the present invention, a method and system for implementing an interleaver/deinterleaver for high-speed multi-channel forward error correction using external DDR SDRAM is provided.

According to one exemplary aspect, the interleaver/deinterleaver performs both read and write accesses to the DDR SDRAM that are burst-oriented by hiding active and precharge cycles in order to achieve high data rate operations.

According to another embodiment, the data bus width of the DDR SDRAM is designed to be two times the interleaving symbol size thereby allowing bandwidth to be increased.

According to yet another exemplary embodiment, the interleaver/deinterleaver accesses data in the DDR SDRAM as read blocks and write blocks. Each block includes a predetermined number of data words to be interleaved/deinterleaved. The predetermined number of data words constitutes two sequences. The ACTIVE command for one sequence is issued when a preceding sequence is being processed. Data in one read/write sequence has the same row address within the same bank of the DDR SDRAM.

Some embodiments of the present invention provide a method for outputting interleaved data stored in a device having a double data rate random access memory. The method includes determining a first row in a output buffer included in the device, wherein the first row contains a first symbol, determining a first location for the first symbol, the first location corresponding to a first row address and a first column address, reading the first symbol from the first location, determine a second location for a second symbol in a second row, and reading the second symbol from the second location.

Reference to the remaining portions of the specification, including the drawings and claims, will realize other features and advantages of the present invention. Further features and advantages of the present invention, as well as the structure and operation of various embodiments of the present invention, are described in detail below with respect to accompanying drawings, like reference numbers indicate identical or functionally similar elements.

DETAILED DESCRIPTION OF SPECIFIC EMBODIMENTS

Figure 1:
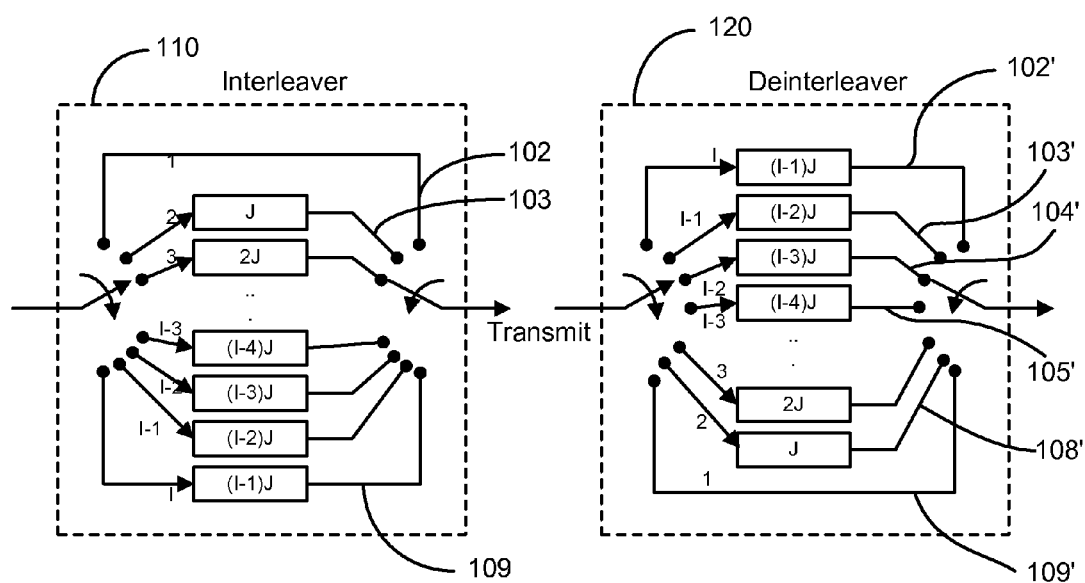
FIG. 1 is a simplified schematic block diagram illustrating a typical convolutional interleaver and deinterleaver.
Figure 2:
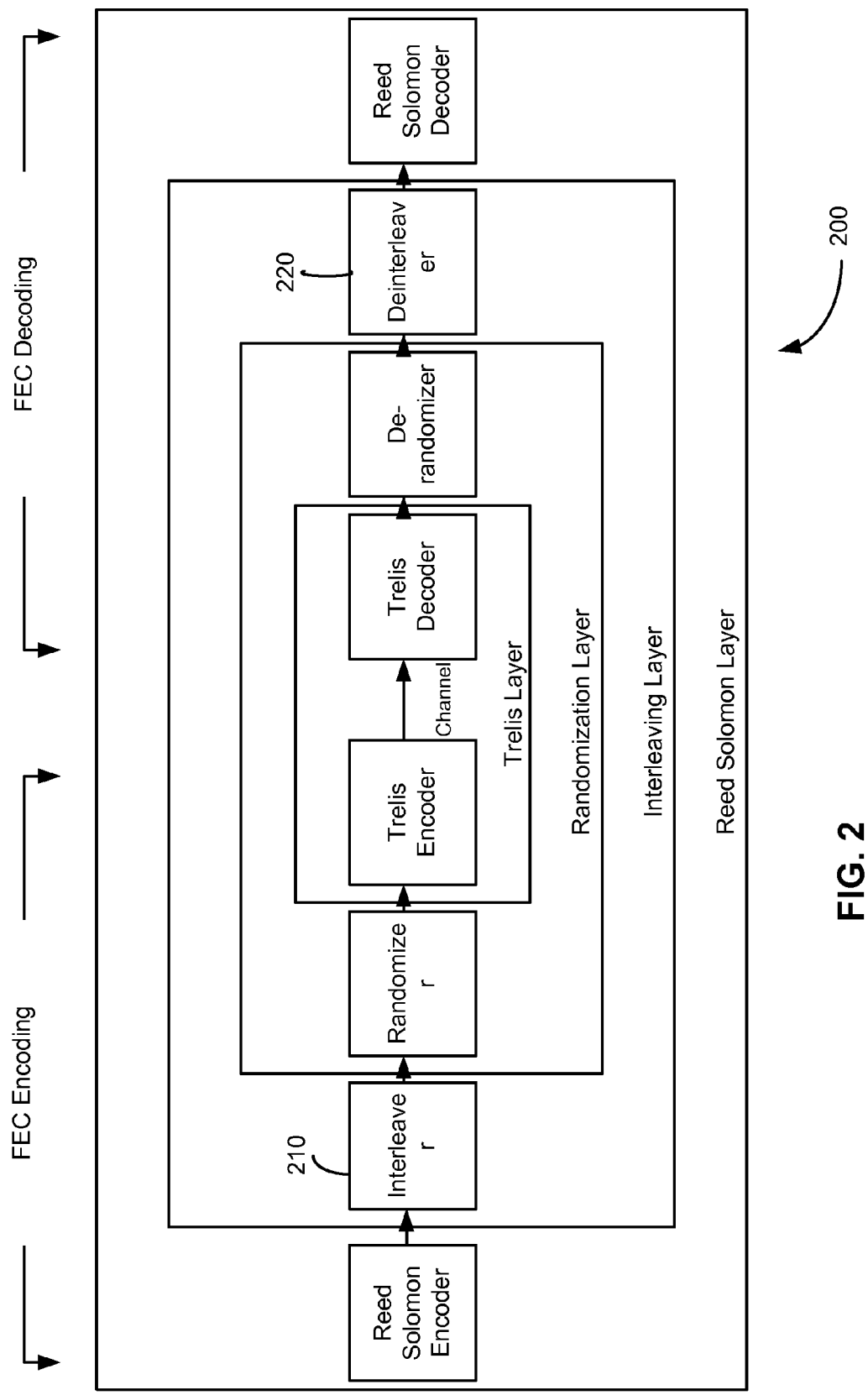
FIG. 2 is a block diagram illustrating a channel coding scheme according to an embodiment of the present invention.
Figure 3:
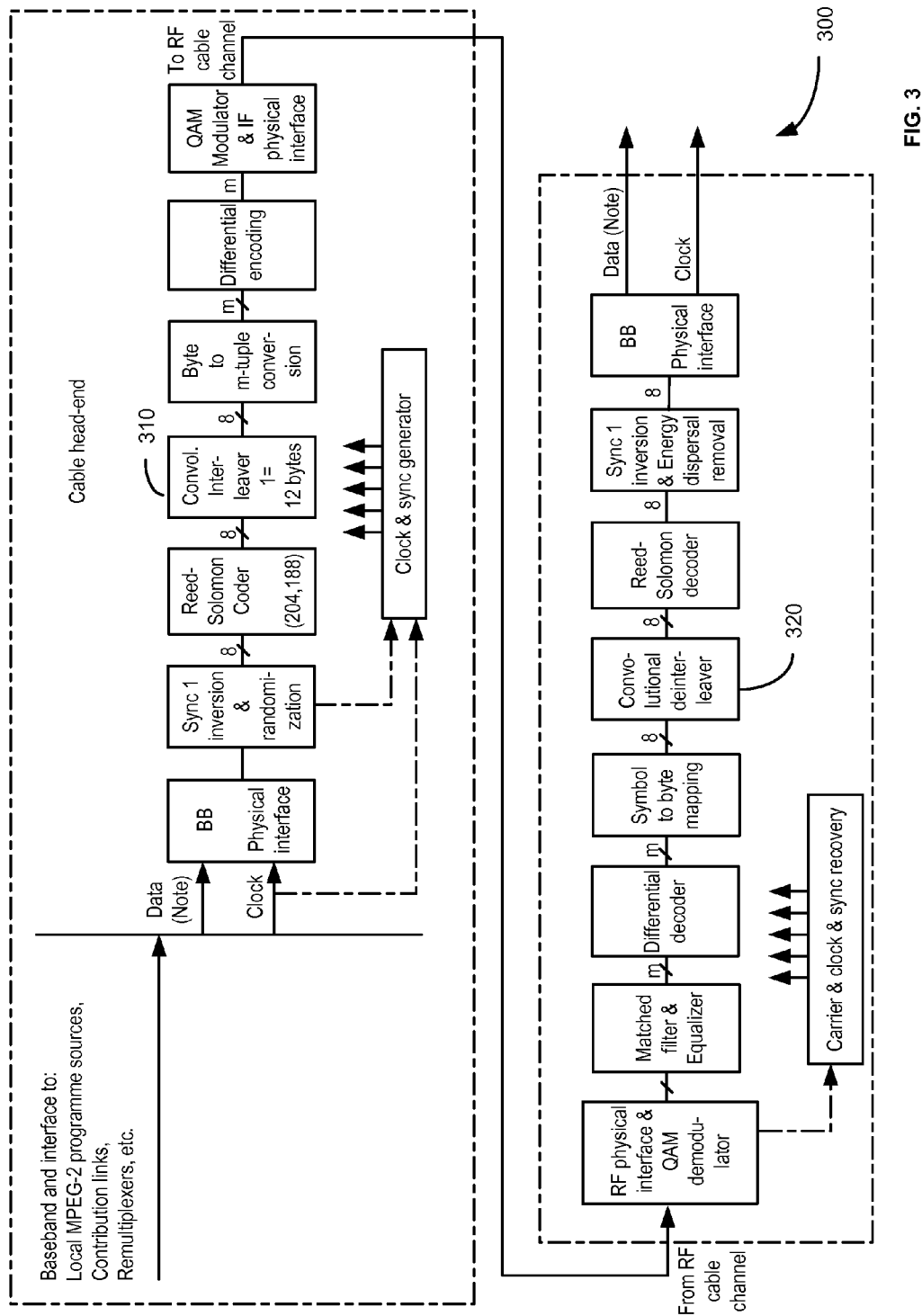
FIG. 3 is a block diagram illustrating an interleaver/deinterleaver implemented in a channel coding scheme according to another embodiment of the present invention.

FIG. 2 is a schematic of illustrating a channel coding apparatus 200 including a forward error correction mechanism according to an embodiment of the present invention. Processing apparatus 200 can be implemented, for example, in a channel coding processor, or the like. In addition to other components, processing apparatus can include an interleaver 210 and a deinterleaver 220. FIG. 2 illustrates an embodiment of how and where in the channel coding scheme the interleaver 210 and deinterleaver 220 fit in. FIG. 3 illustrates a channel coding scheme 300 according to another embodiment of the present invention. Processing scheme 300 includes an interleaver 310 and a deinterleaver 320, among other components.

Figure 4:
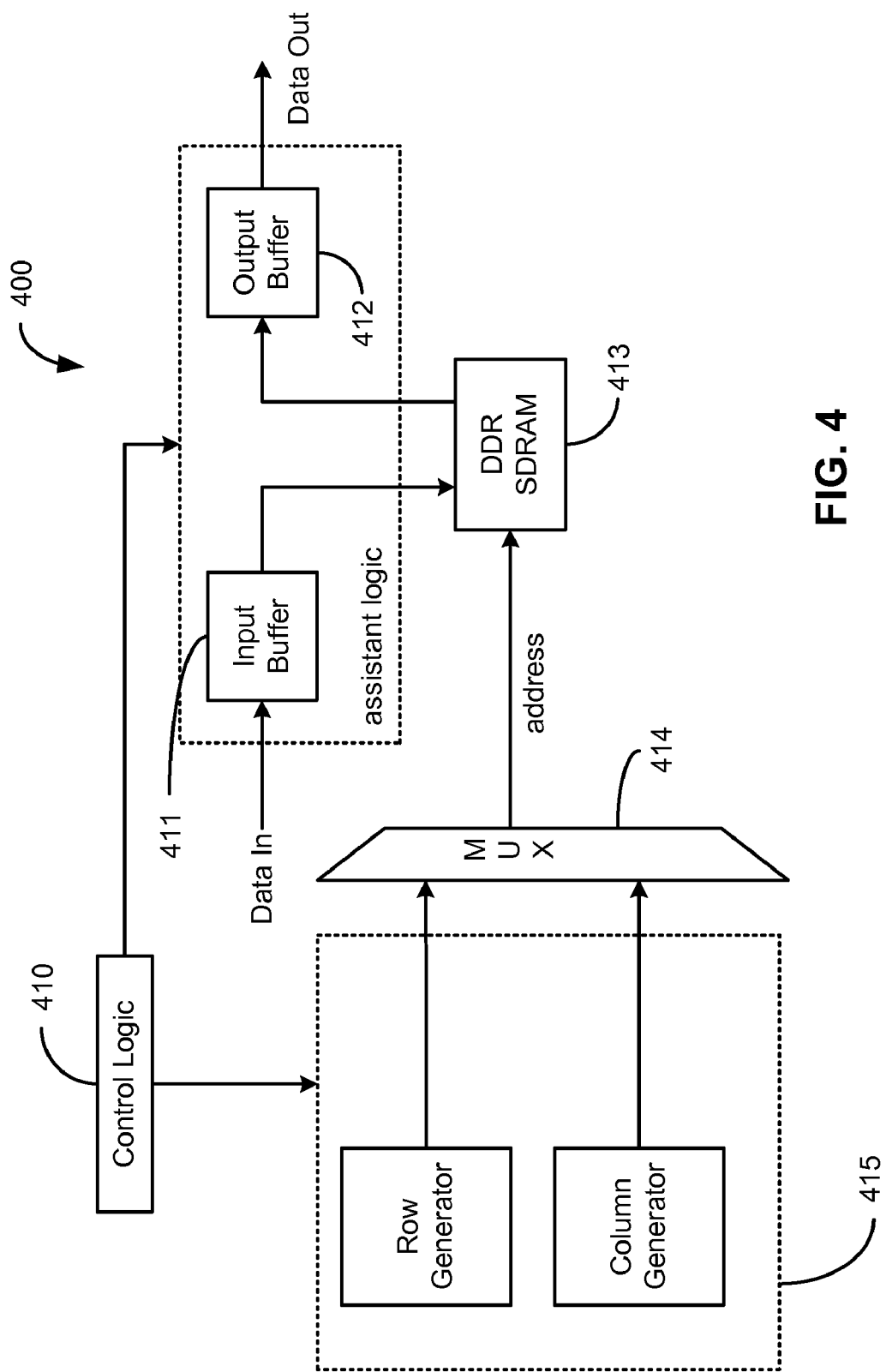
FIG. 4 is a simplified block diagram of a convolutional interleaver/deinterleaver according to an embodiment of the present invention.

FIG. 4 illustrates a simplified block diagram of a convolutional interleaver/deinterleaver 400 according to one exemplary embodiment of the present invention. The convolutional interleaver/deinterleaver 400 is implemented using a DDR SDRAM 413. In this disclosure any reference to DDR SDRAM includes DDR, DDR2, and DDR3 SDRAM. In one embodiment, the data or symbol size is eight (8) bits and the DDR bus width is (16) bits. For DDR, a minimum of 4 symbols are combined to form a word. For DDR2 memory, a minimum of 8 symbols are combined to form a word and for DDR3 a minimum of 16 symbols are combined to form a word. In some embodiments, the symbol size may take other values such as 16 bits, 32 bits, etc., and the word size is chosen to be DDR SDRAM bus width times DDR SDRAM burst length.

As shown in FIG. 4 the input buffer 411 combines four symbols in the same branch of the interleaver 400 into a word. The delay between two symbols in the same branch is an integer multiple of the interleaving depth I. For each word, the input buffer 411 stores the first symbol until the last symbol of the word is received. Several symbols are combined to form a word. When a predetermined number of words for one channel are stored in the input buffer 411, such words, collectively a write block as described further below, are forwarded to the DDR SDRAM write buffer (not shown) for write processing. According to a preferred embodiment, the word size equals to the product of the DDR SDRAM data width and the DDR SDRAM burst length. Typically, the burst length for DDR is 2, the burst length for DDR2 is 4, and the burst length for DDR3 is 8.

Control logic 410 generates a periodic address sequence for the input buffer 411 for the incoming data so that several symbols of one channel are combined to form a word. For example, for a DDR SDRAM, 4 symbols can be combined to form a word. The control logic 410 also communicates with address generation logic 415 in order to store the words in the DDR SDRAM 413. In some embodiments, input buffer 411 and output buffer 412 can be implemented as an on-chip memory to provide faster access speeds. The details of writing data into and reading data from a SDRAM are disclosed in commonly assigned U.S. Pat. No. 7,051,171, the content of which are incorporated by reference herein in its entirety for all purposes. In some embodiments, the interleaver provides sequential writing and non-sequential reading capability or vice versa. Input buffer 411 and output buffer 412 can do symbol reordering such that DDR read/write operation obtains high burst efficiency. To reach high efficiency of DDR bandwidth, input buffer 411 combines several symbols into one word for a single DDR read/write burst. The word size equals to the product of DDR data width and DDR burst length. Output buffer 412 stores and converts the word to symbols for output.

In some embodiments, output buffer 412 sequentially and circularly outputs data of each branch. In one embodiment, output buffer 412 reads data in a word-by-word manner from the DDR memory. Output buffer 412 outputs symbols, combined to form words, from the first branch to the last branch. The process of reading symbols from each branch and one or more words from the DDR memory and storing the words in empty symbol spaces of the output buffer will be explained detail below. A person skilled in the art will realize that a deinterleaver using the same approach as described above can be implemented.

Figure 5:
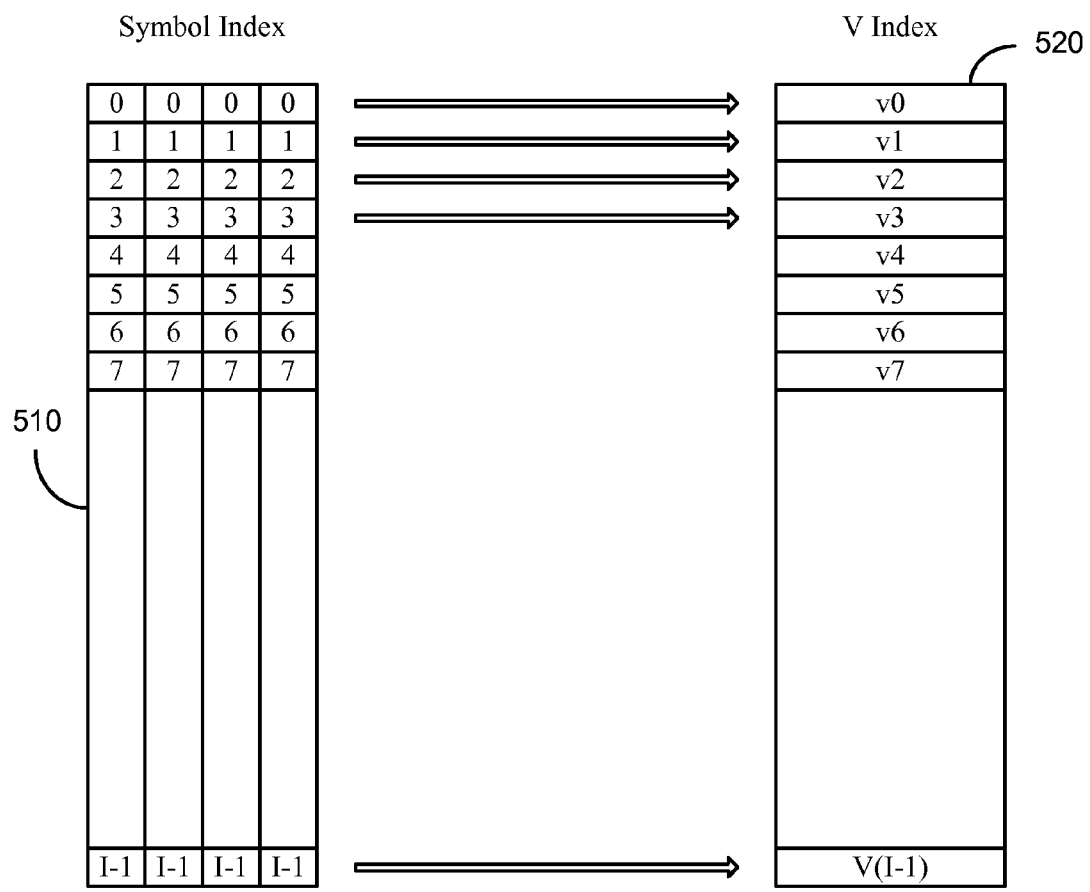
FIG. 5 illustrates the process of forming a word according to an embodiment of the present invention.

FIG. 5 illustrates how several symbols can be combined to form a word according to an embodiment of the present invention. In some embodiments, word size equals to the product of DDR data width and DDR burst length. Hereinafter, a word is referred to as a 'V-vector'. Symbols included in a V-vector are from the same branch and in sequence. The number of V-vectors in one U-block is equal to the interleaving depth. As illustrated in FIG. 5, four 8-bit RS symbols from 4 consecutive RS blocks are combined to form a single V-vector 520. The symbols in one V-vector are both not contiguous in the input sequence and not contiguous in the output sequence. The combination scheme for generating V-vector influences the size requirement for both input buffer and output buffer.

Figure 6:
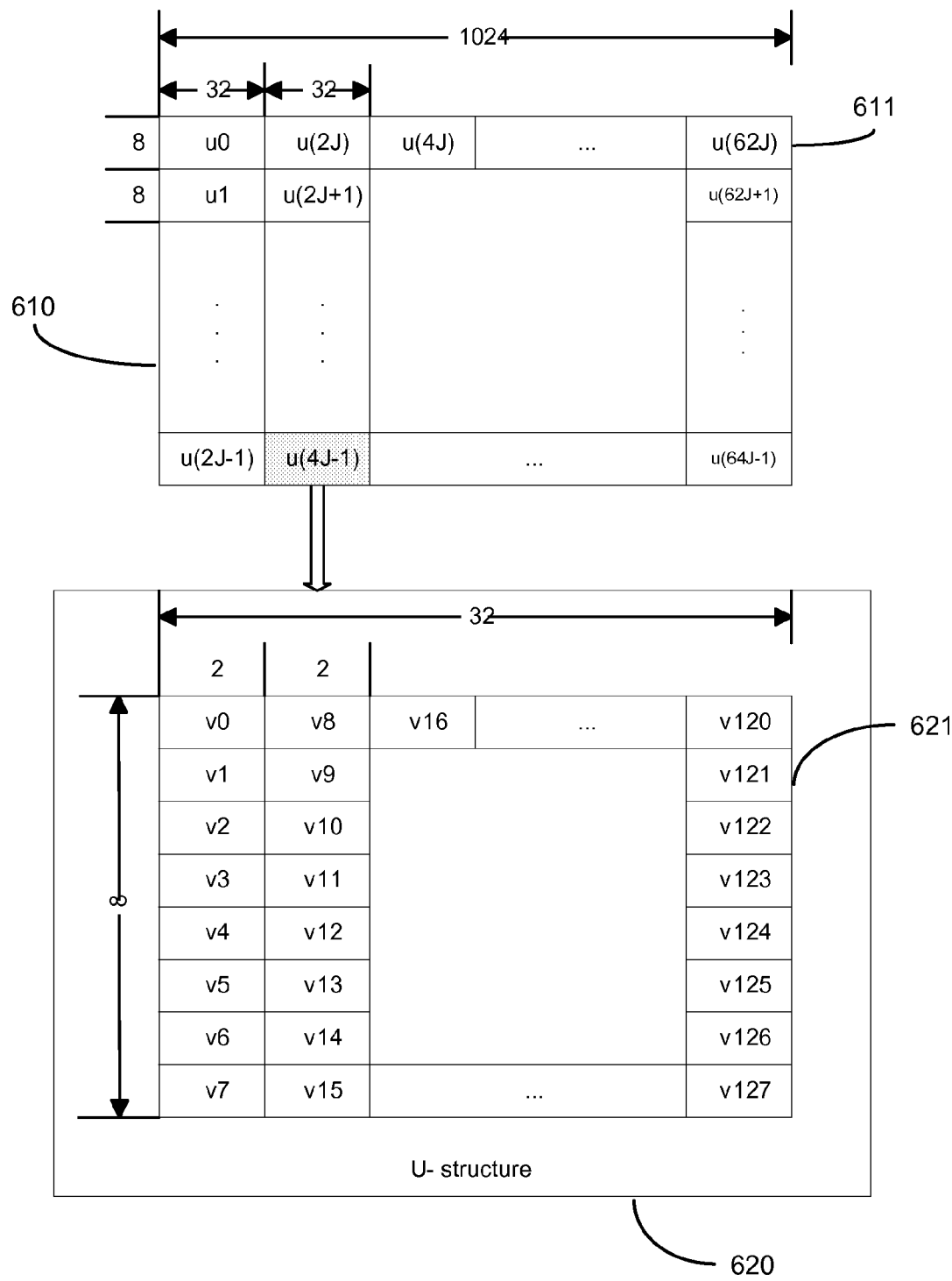
FIG. 6 illustrates structure of a 'U' block according to an embodiment of the present invention.

FIG. 6 illustrates a section 610 of the DDR memory when an interleaver where the interleaving depth I is kept constant, e.g., 128, and the interleaving increment J is varied, e.g., from 1 to 8, is used according to an embodiment of the present invention. In an embodiment, 128 V-vectors form one U-block 611. Each U-block 611 is then stored in the DDR memory at a specific row and column address. Each U-block 611 includes 128 V-vectors 621. The embodiment in FIG. 6 is used to reduce channel interference and when better error recovery performance is desired even though this embodiment increases the latency for reading and writing data.

Figure 7:
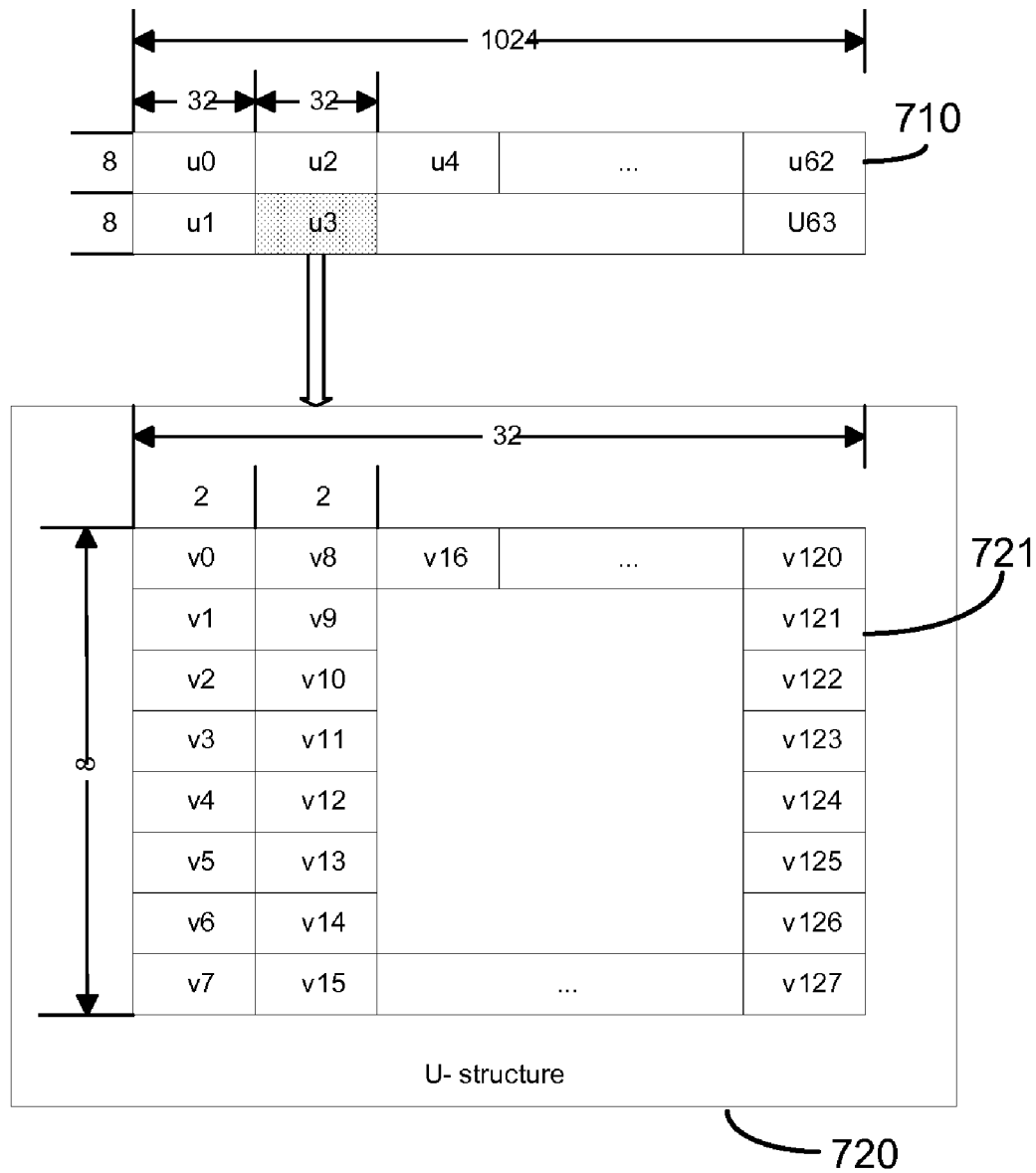
FIG. 7 illustrates structure of a 'U' block according to another embodiment of the present invention.

FIG. 7 shows a section 710 of DDR memory according to another embodiment of the present invention. In this embodiment the product of the interleaving depth I and the interleaving increment J (I*J) is held constant. As can be seen, the arrangement of the U-blocks is now different from that shown in FIG. 6. However, each U-block 720 still includes 128

V-vectors 721. When data is stored using this scheme, the total memory requirement is less than when the data is stored using the embodiment shown in FIG. 6. One of the advantages of using this scheme is there is less latency in data read and write operations although the error correction capability is lower than the scheme illustrated in FIG. 6.

Figure 8:
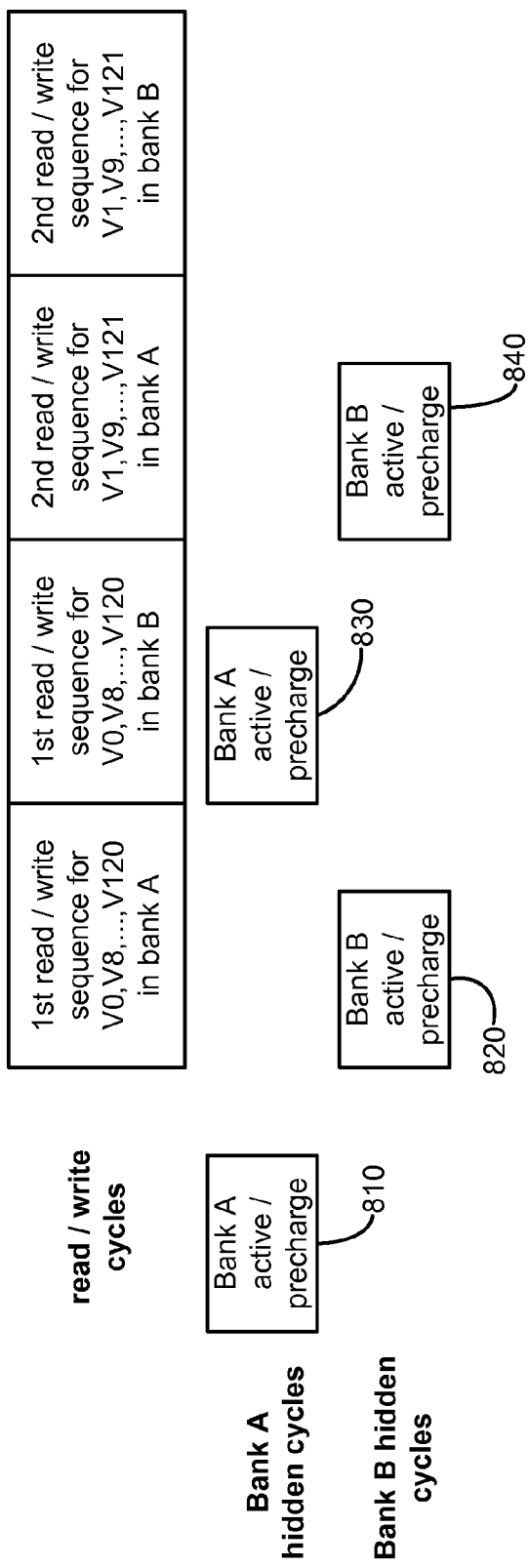
FIG. 8 is an illustration of the hidden cycles method for reading from or writing to a DDR memory according to an embodiment of the present invention.

FIG. 8 is a simplified schematic diagram illustrating how data is written into and read out of a DDR memory according to an embodiment of the present invention. In this embodiment, one DDR read/write sequence is defined as continuous DDR read/write accesses occurring in the same bank and the same row in that bank. Data is written into the DDR memory one or more V-vectors at a time. One V-vector or word is written and read at every pair of rising and falling edge of the clock. In one embodiment, 16 clock cycles represent one write command cycle. In some embodiments, 8 command cycles are needed to write one U-block into the DDR memory. The DDR memory comprises multiple banks of data storage locations. At any given time data can be read from or written into only one bank of the DDR memory.

Consider a DDR memory having memory bank A and memory bank B. Before data can be read from or written into memory bank A, bank A has to be activated. After an ACTIVE command 810 is executed for bank A, there is a slight delay before a word can be read from or written into the bank A. To maximize the data read/write efficiency, while data is being read from or written into the bank A, a second ACTIVE command 820 is executed for bank B. After the bank A completes data reading or writing, bank B is ready for data writing/reading. While data is being read from or written into bank B, the bank A is being precharged for the previously activated row and activated for another row. Thus, data can be alternately and seamlessly written into bank A and bank B thereby maximizing the efficiency of the read/write process. It is to be noted that the read/write process for a DDR was explained using only two banks for simplicity. One skilled in the art will realize that DDR memory includes multiple banks and data can be written into these multiple banks using the same approach as described above.

Figure 9:
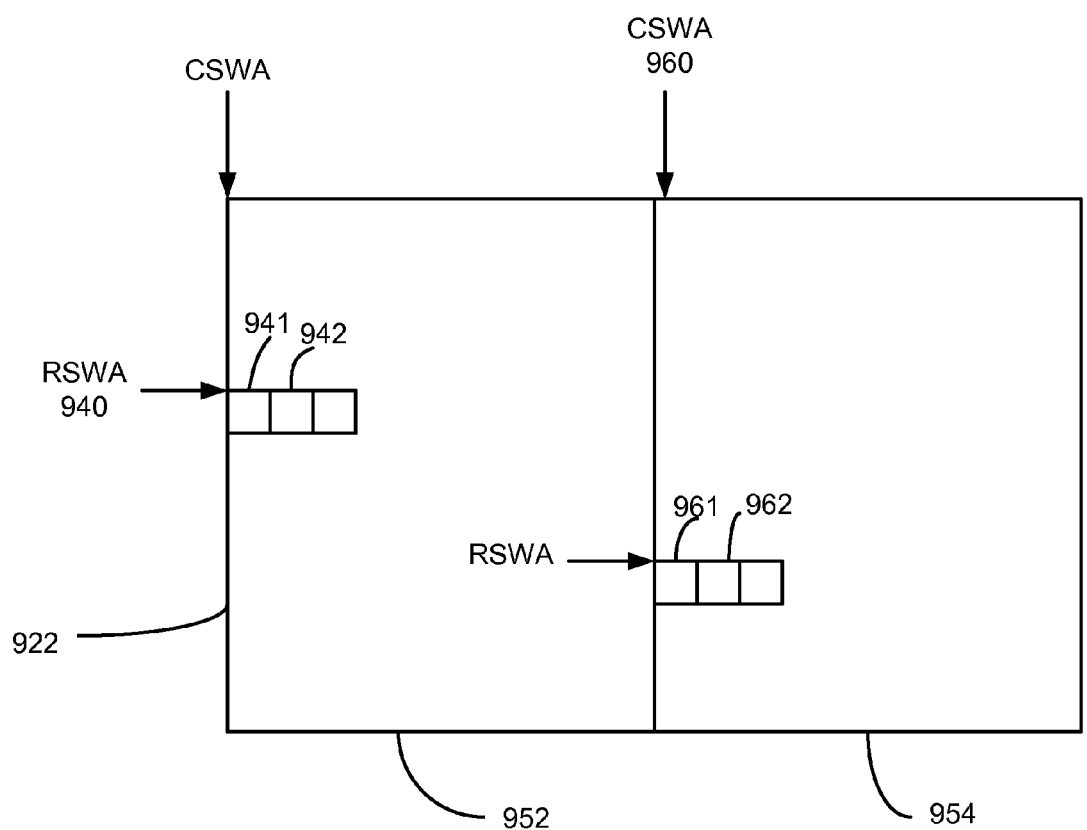
FIG. 9 is a simplified schematic diagram illustrating how data are written into the memory of the convolutional interleaver/deinterleaver according to an embodiment of the present invention.

FIG. 9 is a simplified schematic diagram illustrating how data are written into the DDR SDRAM 922 according to one exemplary embodiment of the present invention. As shown in FIG. 9, data are written to the DDR SDRAM 922 V-vector by V-vector. Two or more V-vectors from the same row of a U-block are formed as one write block that is further divided into two sequences for DDR write bursts. In this illustration, 16 V-vectors are formed as one write block, each V-vector having a length of 32 bits, e.g., V-vectors 621 of FIG. 6. For ease of explanation we will consider a write block being written into two banks 952 and 954 of DDR SDRAM 922. For each block that is to be written into the DDR SDRAM 922, the first sequence of the write block has a starting row address RSWA 940 and consecutive column addresses (941, 942, . . . , ) in the first bank 952. The second sequence of the write block is written with consecutive column addresses (961, 962, . . . , ) in the second bank 954 and may (or may not) have the same row address 940 as the first V-vector written into the first bank 952. In another embodiment, non-consecutive column addresses can be used.

In some embodiments, the write addresses is generated as follows. For each write block that writes two or more V-vectors of a U-block, the row and column address of the U-block are first determined. The row and column address of the first V-vectors of the write block are then determined within that U-block.

The row address of U-blocks is initialized to an appropriate value, namely, U-block start row address (USRA). The row address of the next U-block for the same channel is incremented by one until the last row for that channel is reached. Consequently, the next U-block can be written to the next row. In some embodiments, the number of rows of U-blocks is predetermined such that two or more V-vectors from the same or different U-blocks can be read out of the DDR memory together to hide the DDR commands that will be explained below.

In an embodiment, the number of rows of U-blocks is 2. In another embodiment, the number of rows of U-blocks is equal to twice of the interleaving increment J. When the last row is reached for one channel, the row address for that channel is reset to the USRA and column address of U-blocks is incremented by one.

For each write block, the row address of V-vectors within a U-block is initialized to an appropriate value, namely, a row start write address (RSWA) 940. The row address of the next write block in the same bank for the same channel is incremented by an appropriate value such that the V-vectors with the same rows within U-blocks have the same row address for DDR write bursts. In this manner, the subsequent V-vectors of the current and next U-blocks can be read using the same respective row addresses, based on the delay characteristics of the convolutional interleaver/deinterleaver.

For each write block, the column address begins with an appropriate value, namely, a column start write address (CSWA) 960. In an embodiment, the CSWA is equal to zero (0). The column address for the next V-vector within a write sequence to be written into the same bank for one channel is incremented by one. In an embodiment, the number of columns for V-vectors within a U-block is a factor of the number of branches. For example the number of columns is 16.

Based on the disclosure and teachings provided herein, a person of ordinary skill in the art will know and appreciate how to produce the physical row and column addresses of the DDR SDRAM 922 from the row and column addresses of U-blocks and V-vectors.

In an embodiment, the same RSWA and CSWA are used when writing to the second bank 954. In other words, addressing the DDR SDRAM 922 to write V-vectors from different sequences of the write block may be the same except with different bank addresses. It should be noted that, in an alternative embodiment, the RSWAs and the CSWAs for the first and second banks 952, and 954 may not be the same. For purposes of this disclosure, one read/write sequence is defined as continuous DDR SDRAM read/write accesses occurring in the same row of the same bank. The period of DDR SDRAM read/write sequences for a given bank is longer than the DDR SDRAM ACTIVE and PRECHARGE command cycles, hence, the ACTIVE and PRECHARGE command cycles are hidden to achieve maximum throughput.

In some embodiments, an increase in read/write efficiency is achieved by hiding the ACTIVE and PRECHARGE commands for the DDR SDRAM. In an embodiment, after a row in the first bank 952 is activated by an ACTIVE command (e.g., command 810 of FIG. 8), the V-vectors in the first sequence of a write block are written into the first bank 952 of the SDRAM 922 with column addresses (941, 942, . . . ). While the first sequence of the write block is being written into the first bank 952, a row in the second bank 954 is activated by another ACTIVE command (e.g., command 820 of FIG. 8). The activation of the second bank 954 during this time is performed such that the ACTIVE and the PRECHARGE periods are hidden.

Once the V-vectors in the first sequence of the write block have been written into the DDR SDRAM 922, the row in the first bank 952 that has previously been activated for the first sequence is deactivated by a PRECHARGE command. While this deactivation of the row in the first bank 952 is in progress, the words in the V-vectors in the second sequence are written into the second bank 954 of the DDR SDRAM 922 with column addresses (961, 962, . . . ). It should be remembered that the writing of the V-vectors in the second sequence can be performed at this point because the second bank 954 has already been activated. While the V-vectors in the second sequence are being written into the second bank 954, a row in the first bank 952 is activated by an ACTIVE command for V-vectors in a second write block to be written.

Once the V-vectors in the second sequence have been written into the second bank 954, the row in the second bank 954 that has previously been activated for the second sequence is deactivated by a PRECHARGE command. The foregoing process is then repeated. During writing the last V-vector in the last block of a write phase, an ACTIVE command is used to activate the first bank of the first read block for the next read phase (if any) so that the read phase can be started immediately after the write phase.

An exemplary embodiment of the present invention as described herein is illustrated in the context of a DDR SDRAM having two banks. However, based on the disclosure and teachings provided herein, it will be appreciated by a person of ordinary skill in the art that the present invention can be applied to a DDR SDRAM or other memory having more than two banks. For example, in an alternative exemplary embodiment, the present invention can be applied to multiple pairs of banks in a DDR SDRAM.

Once the data is stored in the DDR, the data is then read out from the DDR and written to the output buffer, e.g., output buffer 412 of FIG. 4. Subsequently the data is read out of the output buffer. The details of reading data from the DDR and writing it to the output buffer and reading the data out of the output buffer are described below.

In some embodiments, the output buffer sequentially and circularly outputs data of each branch. In an embodiment, the output buffer has I buffer lines, where I is the deinterleaving depth. Each buffer line stores a V-vector (the same V index) being output for one branch. For example, the first buffer line is for V0, the second buffer line is for V1, and so on. Note that each branch has a different delay from each other branch. These V-vectors may or may not belong to the same U-block.

The output buffer outputs symbols by reading one-by-one from the first branch to the last branch. For example, the first symbol is output from the first buffer line, the second symbol from the second buffer line, and so on until the last buffer line. Hereinafter, this is called as one read cycle. For each read cycle, each buffer line outputs one symbol.

In some embodiments, the output buffer reads data in a V-vector-by-V-vector manner. To reduce the hardware complexity, in this embodiment of the present invention, the output buffer is divided into one or more groups. One group has the number (N) of buffer lines equal to the number of symbols in a V-vector. After a read cycle, a group outputs N symbols and has at least N empty symbol spaces. The group can then accept a next V-vector (N symbols) to fill up the emptied spaces. These symbol spaces may or may not be the same location where the V-vector was previously stored because there are different delays between branches. FIG. 10 illustrates an embodiment that is explained below. To make the DDR access process efficient, V-vectors of one or more groups are further read together in one or more bursts from the same row of the DDR memory and then filled up to their respective empty symbol spaces. In some embodiments, reading these V-vectors together can be performed because the V-vectors are so structured that these V-vectors are in the same row of the same bank in the DDR memory. For example, V-vectors v0, v8, v16, etc. of the same or different U-blocks are read as groups, as shown in FIGS. 6 and 7. Based on the delay characteristics of the convolutional interleaver/deinterleaver, the schemes for reading symbols out of the output buffer can be column-by-column, row-by-row, diagonal-by-diagonal, or some other manner.

Figure 10A:
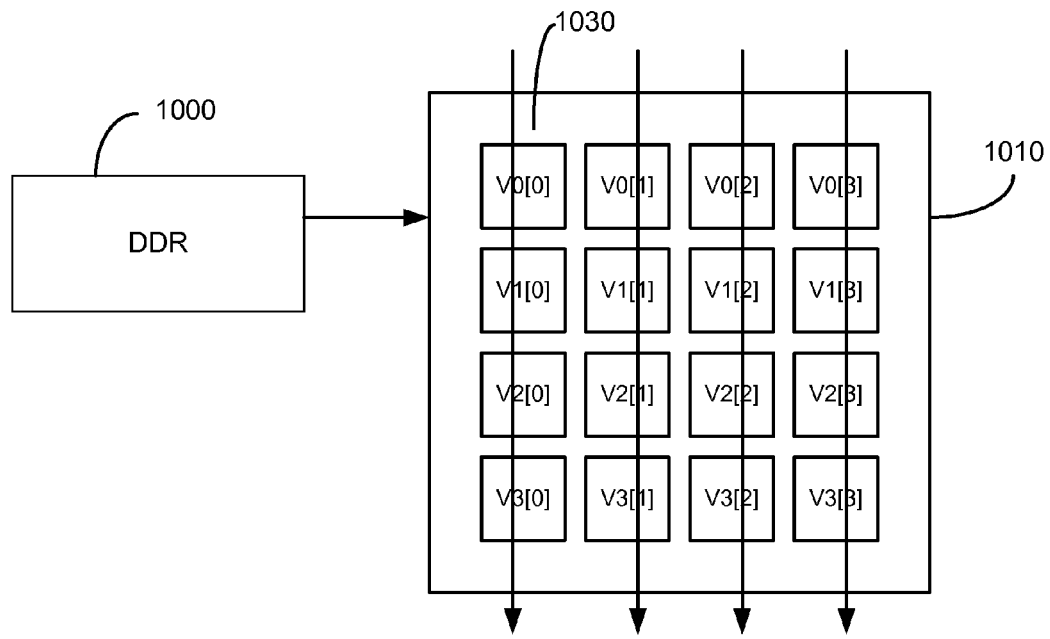
FIG. 10 illustrates a method for writing data into and reading data from the output buffer according to an embodiment of the present invention.
Figure 10B:
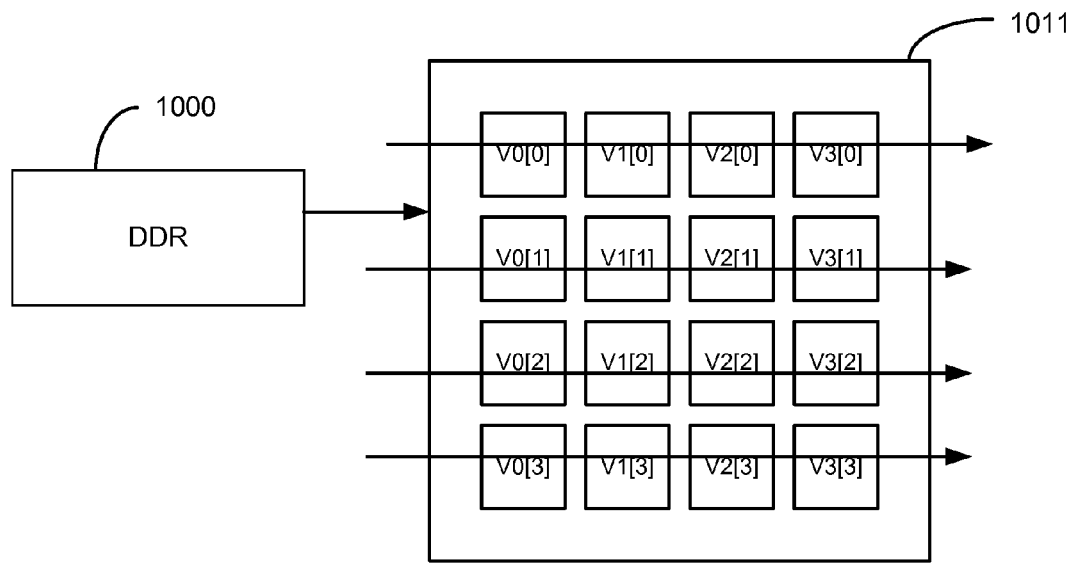

FIG. 10A shows a scheme for reading out symbols from a group of the output buffer 1010 in a column-by-column manner according to an embodiment of the present invention. V-vectors from the DDR memory 1000 are stored in the output buffer row by row. The symbols stored in the output buffer are then read out in a column-by-column manner. In the embodiment illustrated in FIG. 10A where one V-vector consists of four symbols, when four symbols are read (one from each row), a next V-vector will be written into the output buffer. In order to read out the data in the column-by-column manner, the data is stored in the above buffer such that symbols in one column are in sequence. FIG. 10B illustrates an embodiment where the symbols from a group of output buffer 1011 are read out in a row-by-row manner. In order to read out the data in a row-by-row manner, the data is stored in output buffer 1011 such that symbols in a row are in sequence. In one embodiment, the V-vectors are stored column-by-column so that symbols in a row are in sequence.

In some embodiments, the process of writing data into the output buffer alternates between row-by-row manner and column-by-column manner. When the data is written into the output buffer in a row-by-row manner, the data is read out of the output buffer in a column-by-column manner. When the data is written into the output buffer in a column-by-column manner, the data is read out of the output buffer in a row-by-row manner. In some embodiments, not all V-vectors from a single U-block are read from the DDR sequentially. Various V-vectors from different U-blocks may be read out of the DDR memory. For example, in one read command, 16 V-vectors may be read out, one from each of 16 U-blocks of the DDR memory.

In some embodiments, symbols in the output buffer 1010 are arranged in a manner such that symbols can be consecutively read out column by column. For example, as illustrated in FIG. 10A, during a first read cycle, symbols, which are in sequence, are read out from the first column 1030 of the output buffer 1010. In subsequent read cycles, symbols from the second, third, and fourth columns are read out. During a first write cycle, symbols are stored in the emptied space of the first column of the output buffer 1010. During subsequent write cycles, symbols are stored in the remaining columns of the output buffer 1010 such that after completion of the subsequent write cycles, symbols in the first row are now in sequence. At the start of the next set of read cycles, symbols from the first row are read out followed by the symbols from the second, third and fourth rows, as illustrated in FIG. 10B.

In some embodiments, during a first read cycle, symbols in the output buffer 1011 are read out row by row. For example, as illustrated in FIG. 10B, during a first read cycle, symbols, which are in sequence, from a first row of the output buffer 1011 are read out. In subsequent read cycles, symbols from the second, third, and fourth rows are read out. Thereafter, during a first write cycle, symbols are stored in the emptied space of the first row of the output buffer 1011. After the first read cycle symbols in the output buffer are stored on a row-by-row basis, such that after completion of subsequent write cycles, symbols in each of the columns are now in sequence. At the start of the next set of read cycles, symbols from the first column are read out followed by the symbols from the second, third and fourth columns. This process continues with the read and write cycles alternating in the manner described above so as to provide minimum delay in reading from and writing symbols into the output buffer and thereby increasing the throughput of the data read/write process.

FIGS. 11-14 illustrate various embodiments of symbol read-out schemes from groups of the output buffer, based on the different interleaving increments. In an embodiment, for a read cycle, the row index is incremented by one and the column index is incremented by the interleaving increment J modulo the number of symbols in a V-vector. In another embodiment, the column index is incremented by one and the row index is incremented by the interleaving increment J modulo the number of symbols in a V-vector. It is to be understood that the data arrangements depicted in FIGS. 11-14 represent a snapshot of the output buffer at a given time. One skilled in the art will realize that symbols in the output buffer are in a constant state of flux as data is being written into and read out of the output buffer constantly.

Figure 11:
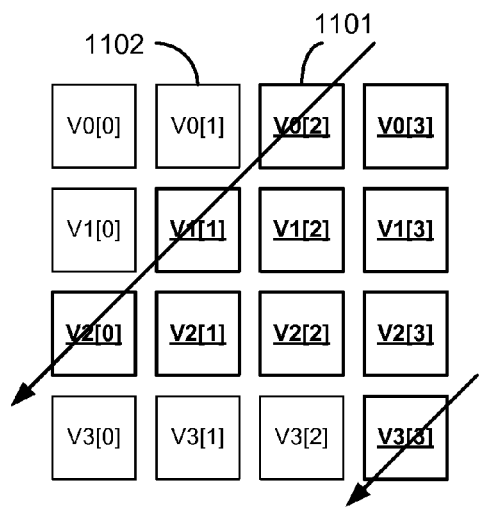
FIG. 11 illustrates a method for writing data into and reading data from the output buffer according to an embodiment of the present invention.

FIG. 11 shows a snapshot of data in a section of the output buffer according to an embodiment of the present invention. In this embodiment, the interleaving increment (J) is 1 modulo the number of symbols in a V-vector. The direction of data read-out is indicated by the arrows. The symbols disclosed in the figures can be identified as follows.

V0[0] means that the first symbol from V-vector 0 in time.

V0[1] means that the second symbol from V-Vector 0 in time.

V1[0] means that the first symbol from V-vector 1 in time.

The symbols shown with an underline indicate presence of those symbols in that location of the output buffer, while the symbols not underlined shows a past or future presence of that symbol in that location. For example, as of the time of the snapshot, location 1101 contains a symbol V0[2] while location 1102 previously had symbol V0[1] or will have symbol V0[1] in the future but presently is empty. In this embodiment, the system is done to ensure that rows are emptied in an efficient manner. Once a symbol is read out, the row address is incremented by one and since the interleaving increment is one, the column address is decremented by one. In this example, the first read cycle will output symbols V0[2], V1[1], V2[0] and V3[3]. After this read cycle is complete, the fourth row is empty and can be filled with a new V-vector. The next read cycle starts by reading the symbol V0[3] and then proceeds to read symbols V1[2], V2[1], and V3[0], respectively. After the second read cycle is completed, the first row will be empty and can be filled with a new V-vector. Then the next read cycle will begin by reading out symbol V0[0], as so on. This reading scheme can be repeated.

Figure 12:
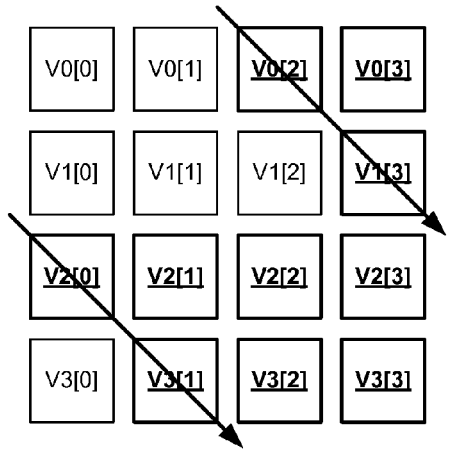
FIG. 12 illustrates a method for writing data into and reading data from the output buffer according to a second embodiment of the present invention.
Figure 13A:
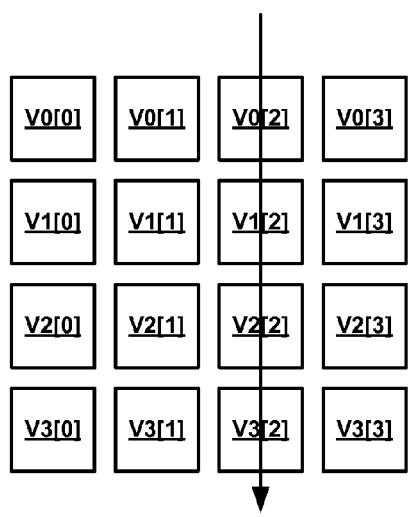
FIG. 13 illustrates a method for writing data into and reading data from the output buffer according to a third embodiment of the present invention.
Figure 13B:
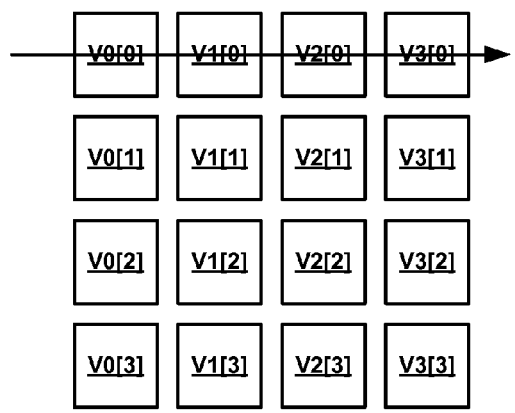

FIG. 12 shows a snapshot of data in a section of the output buffer in an embodiment where the interleaving increment is 3 modulo the number of symbols in a V-vector. In this case, following the logic discussed in relation to FIG. 11, during a first read cycle, symbol V0[2] is read out first, followed by symbols V1[3], V2[0] and V3[1], respectively. FIG. 13 illustrates an embodiment where the interleaving increment is equal to 4. In this embodiment the symbols can be read out either one column at a time or one row at a time in an alternating manner. In addition, when the data is read out of the output buffer in accordance with this embodiment, data is stored in the output buffer by implementing a phase change mode. Phase change mode means that in one write cycle data is written into the output buffer one column at a time and during the next write cycle, the data is written into the output buffer one row at a time, e.g., as described in relation to FIG. 10.

Figure 14:
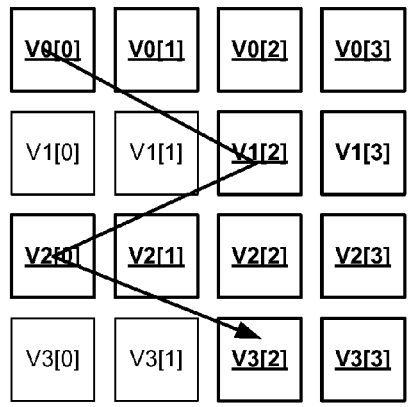
FIG. 14 illustrates a method for writing data into and reading data from the output buffer according to a fourth embodiment of the present invention.

FIG. 14 shows a snapshot of data in a section of the output buffer in an embodiment where the interleaving increment is 2 modulo 4. In this case, the sequence of reading out Vn[m] is that n is incremented by one and m is incremented by 2 modulo 4. For example, during a first read cycle, symbol V0[0] is read out first, followed by symbols V1[2], V2[0] and V3[2], respectively. After the first two read cycles, there are eight empty spaces for V-vectors 1 and 3. Therefore, during the first two write cycles, V-vectors 1 and 3 are written as V1[0], V1[1], V1[2], V1 [3] and V3[0], V3[1], V3[2], V3[3]. After the next two read cycles, there are eight empty spaces for V-vectors 0 and 2. Therefore, during the next two write cycles, V-vectors 0 and 2 are written as V0[0], V0[1], V0[2], V0[3] and V2[0], V2[1], V2[2], V3[2]. The next two read cycles can be same as the first two read cycles, the spaces for V-vectors 1 and 3 are emptied and written into. The foregoing process is then repeated.

As seen in FIGS. 11-14, the process of data retrieval from the output buffer is dependent on the interleaving increment used for the data. The illustrations in FIGS. 11-14 represent only some of the embodiments of data read/write processes that may be used. One skilled in the art will realize various other data read/write techniques can be implemented based on the interleaving increments. In addition, a scheme where the number of symbols in a V-vector is other than four can be easily implemented by one skilled in the art based on teachings provided in the present disclosure.

Figure 15:
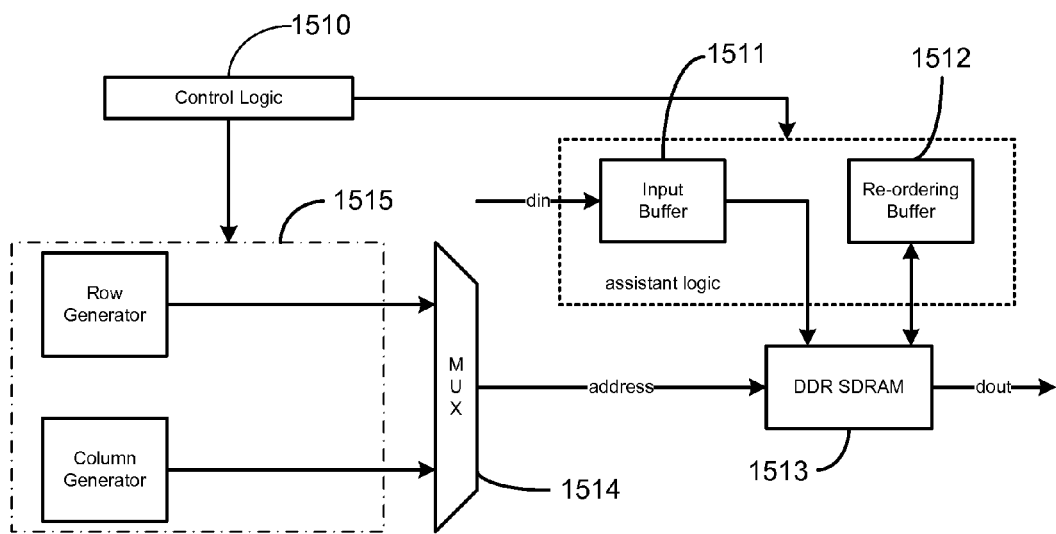
FIG. 15 is a simplified block diagram of a convolutional interleaver/deinterleaver according to another embodiment of the present invention.

FIG. 15 shows another embodiment of an interleaver according to an embodiment of the present invention. In this embodiment, the data is received by the input buffer 1511 and rewritten into the DDR 1513. Reordering buffer 1512 retrieves the data from DDR 1513, reorders the data and writes the data back into DDR 1513. Since reordering buffer does not have to store a large amount of data before the data is read out, the size of reordering buffer 1512 can be smaller than output buffer 412 of FIG. 4. Reordering buffer 1512 performs some of the functions of output buffer 412 of FIG. 4. The data is then read out of DDR 1513 sequentially. This embodiment can be used in instances where the bandwidth is not a bottleneck and where some sacrifice in DDR bandwidth efficiency can be tolerated. One advantage of this embodiment is that it reduces the amount of assistant logic needed for reading/writing data resulting in significant costs savings on the overall design.

It should be understood that the present invention as described above can be realized in the form of control logic, implemented in software or hardware or a combination of both, in either an integrated or distributed manner. A person of ordinary skill in the art will know of other ways and/or methods to implement the present invention. Furthermore, the embodiments and techniques described above are also applicable for implementing a deinterleaver.

It is understood that the examples and embodiments described herein are for illustrative purposes only and that various modifications or changes in light thereof will be suggested to persons skilled in the art and are to be included within the spirit and purview of this application and scope of the appended claims. All publications, patents, and patent applications cited herein are hereby incorporated by reference for all purposes in their entirety.

What is claimed is:

1. A computer-implemented method for handling interleaved data in connection with a device having a double data rate (DDR) random access memory, wherein the device is associated with an interleaving increment and an interleaving depth and wherein the double data rate random access memory includes a first bank and a second bank, the method comprising, by a computer system;

receiving a plurality of symbols;
forming a plurality of words, each word being a product of a DDR data width and a DDR burst length;
forming a plurality of data blocks, each of the data block including two data sequences, wherein each data sequence includes a plurality of words;
storing the plurality of data blocks in the double data rate random access memory in the following manner:
  maintaining a first row start write address (RSWA) and a first column start write address (CSWA) for the first bank;
  retrieving a first data sequence of a first data block, from among the plurality of data blocks;
  writing the plurality of words of the first data sequence into the first bank using the first RSWA and the first CSWA, wherein the plurality of words have the same first RSWA in the first bank and respective column addresses for words in the first data sequence are obtained by changing the first CSWA;
  maintaining a second RSWA and a second CSWA for the second bank;
  retrieving a second data sequence of the first data block; and
  writing the plurality of words of the second data sequence into the second bank using the second RSWA and the second CSWA, wherein the plurality of words in the second sequence block have the same second RSWA in the second bank and respective column addresses for words in the second data sequence are obtained by changing the second CSWA.

2. The method of claim 1, further comprising:
for each data block to be written into memory, determining a starting row address (RSWA) and a starting column address (CSWA) in the respective bank.

3. The method of claim 1, wherein the plurality of words include a plurality of consecutive symbols from an interleaving branch for a channel.

4. The method of claim 3, further comprising:
receiving a first plurality of words for a first interleaving branch;
receiving a second plurality of words for a second interleaving branch;
storing the first plurality of words in a first row of the double data rate random access memory; and
storing the second plurality of words in a second row of the double data rate random access memory.

5. The method of claim 4, further comprising:
receiving a third plurality of words for a third interleaving branch; and
storing the third plurality of words in a third row of the double data rate random access memory, wherein the third row includes words for one or more other interleaving branches.

6. The method of claim 4, further comprising:
receiving a third plurality of words for a third interleaving branch; and
storing the third plurality of words in a third row of the double data rate random access memory, wherein the third row includes preceding words from the third interleaving branch.

7. The method of claim 4, further comprising:
receiving a third plurality of words for a third interleaving branch;
storing the third plurality of words in a third row of the double data rate random access memory, wherein the third row includes words corresponding to twice the interleaving increment preceding words from the third interleaving branch.

* * * * *